(12) United States Patent
Hano

(10) Patent No.: US 12,369,262 B2
(45) Date of Patent: Jul. 22, 2025

(54) DUST-PROOF STRUCTURE

(71) Applicant: TOSHIBA MITSUBISHI-ELECTRIC INDUSTRIAL SYSTEMS CORPORATION, Chuo-ku (JP)

(72) Inventor: Mitsuru Hano, Tokyo (JP)

(73) Assignee: TMEIC CORPORATION, Chuo-ku (JP)

( * ) Notice: Subject to any disclaimer, the term of this patent is extended or adjusted under 35 U.S.C. 154(b) by 53 days.

(21) Appl. No.: 17/998,705

(22) PCT Filed: Sep. 15, 2020

(86) PCT No.: PCT/JP2020/034897
§ 371 (c)(1),
(2) Date: Nov. 14, 2022

(87) PCT Pub. No.: WO2022/059065
PCT Pub. Date: Mar. 24, 2022

(65) Prior Publication Data
US 2023/0209739 A1 Jun. 29, 2023

(51) Int. Cl.
*H05K 5/02* (2006.01)
*H05K 5/03* (2006.01)

(52) U.S. Cl.
CPC ............ *H05K 5/0214* (2022.08); *H05K 5/03* (2013.01)

(58) Field of Classification Search
CPC ........................................................ H05K 7/00
See application file for complete search history.

(56) References Cited

U.S. PATENT DOCUMENTS

2009/0021910 A1* 1/2009 Lai ................... H05K 7/20181
361/695

FOREIGN PATENT DOCUMENTS

| CN | 211792484 U | * | 10/2020 |
| JP | 8-32248 A | | 2/1996 |
| JP | 2015-204415 A | | 11/2015 |
| JP | 2016-111194 A | | 6/2016 |
| JP | 2017-21141 A | | 1/2017 |
| KR | 10-2005-0013273 A | | 2/2005 |

OTHER PUBLICATIONS

International Search Report mailed on Dec. 8, 2020 in PCT/JP2020/034897 filed on Sep. 15, 2020 (4 pages).
Combined Chinese Office Action and Search Report issued Jan. 16, 2025, in corresponding Chinese Patent Application No. 202080101545.5 (with English Translation), 19 pages.

* cited by examiner

*Primary Examiner* — Jerry Wu
(74) *Attorney, Agent, or Firm* — Oblon, McClelland, Maier & Neustadt, L.L.P.

(57) ABSTRACT

A dust-proof structure of an embodiment includes a housing and a magnetic member. The housing accommodates an electric device. The magnetic member is magnetized. The magnetic member is arranged in a flow path of a gas that flows through a ventilation port formed in the housing.

3 Claims, 4 Drawing Sheets

DUST-PROOF STRUCTURE

TECHNICAL FIELD

An embodiment of the present invention relates to a dust-proof structure.

BACKGROUND

In the related art, a control board is known that includes a housing in which an intake port and an exhaust port through which cooling air flows are formed. The control board cools a heat source at the inside using the cooling air introduced to the inside from the outside of the housing.

However, there is a possibility that when conductive fine particles enter the inside of the housing together with the cooling air, an abnormality such as a short circuit may occur at an electric device inside the control board.

RELATED ART DOCUMENTS

Patent Documents

[Patent Document 1]
Japanese Unexamined Patent Application, First Publication No. 2016-111194

SUMMARY OF INVENTION

Problems to be Solved by the Invention

A problem to be solved by the present invention is to provide a dust-proof structure capable of preventing conductive foreign material from entering the inside of a housing.

Means for Solving the Problem

A dust-proof structure of an embodiment includes a housing and a magnetic member. The housing accommodates an electric device. The magnetic member is magnetized. The magnetic member is arranged in a flow path of a gas that flows through a ventilation port formed in the housing.

DESCRIPTION OF THE EMBODIMENTS

Hereinafter, a dust-proof structure of an embodiment will be described with reference to the drawings.

Figure 1:
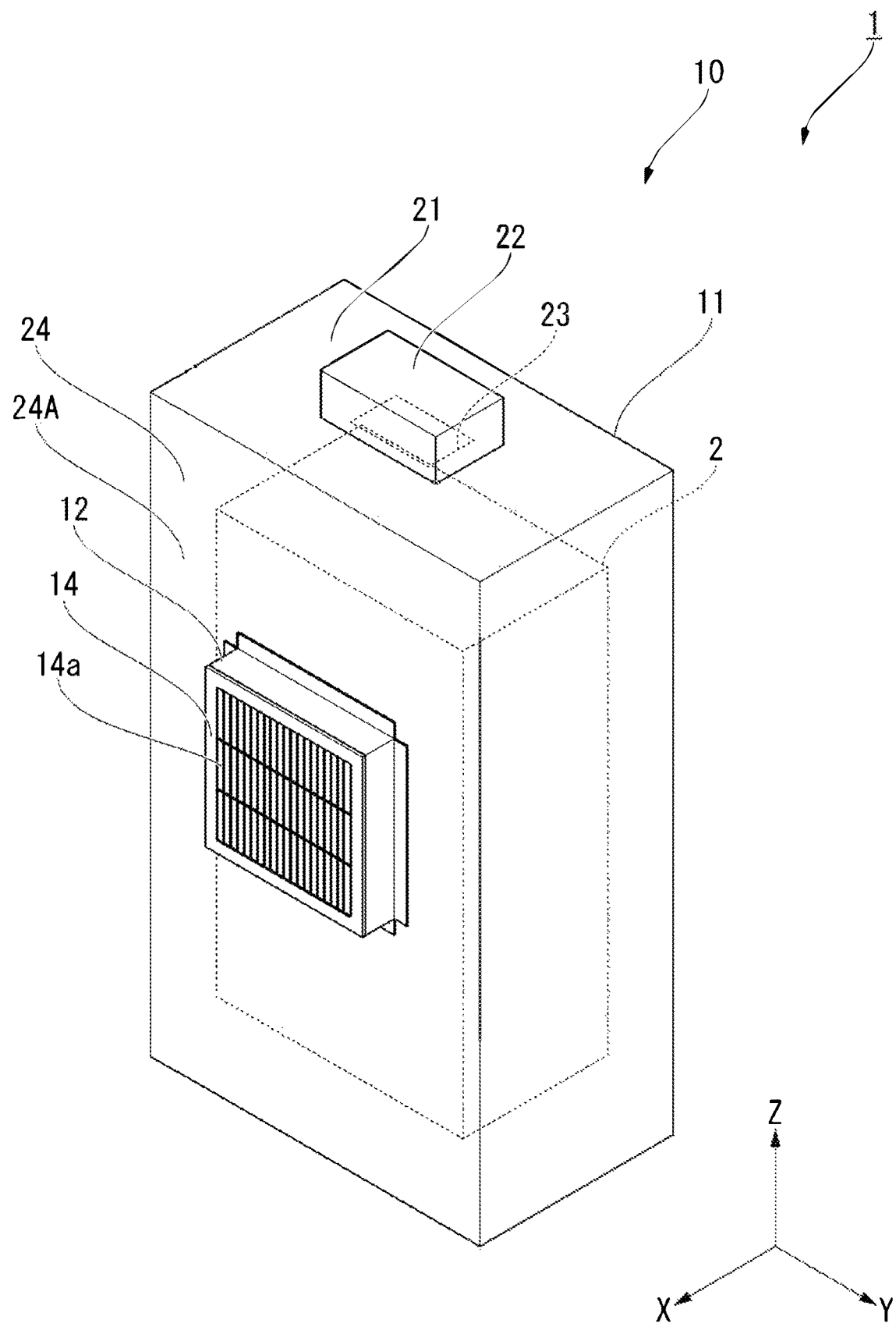
FIG. 1 is a perspective view of a dust-proof structure of an embodiment.
Figure 2:
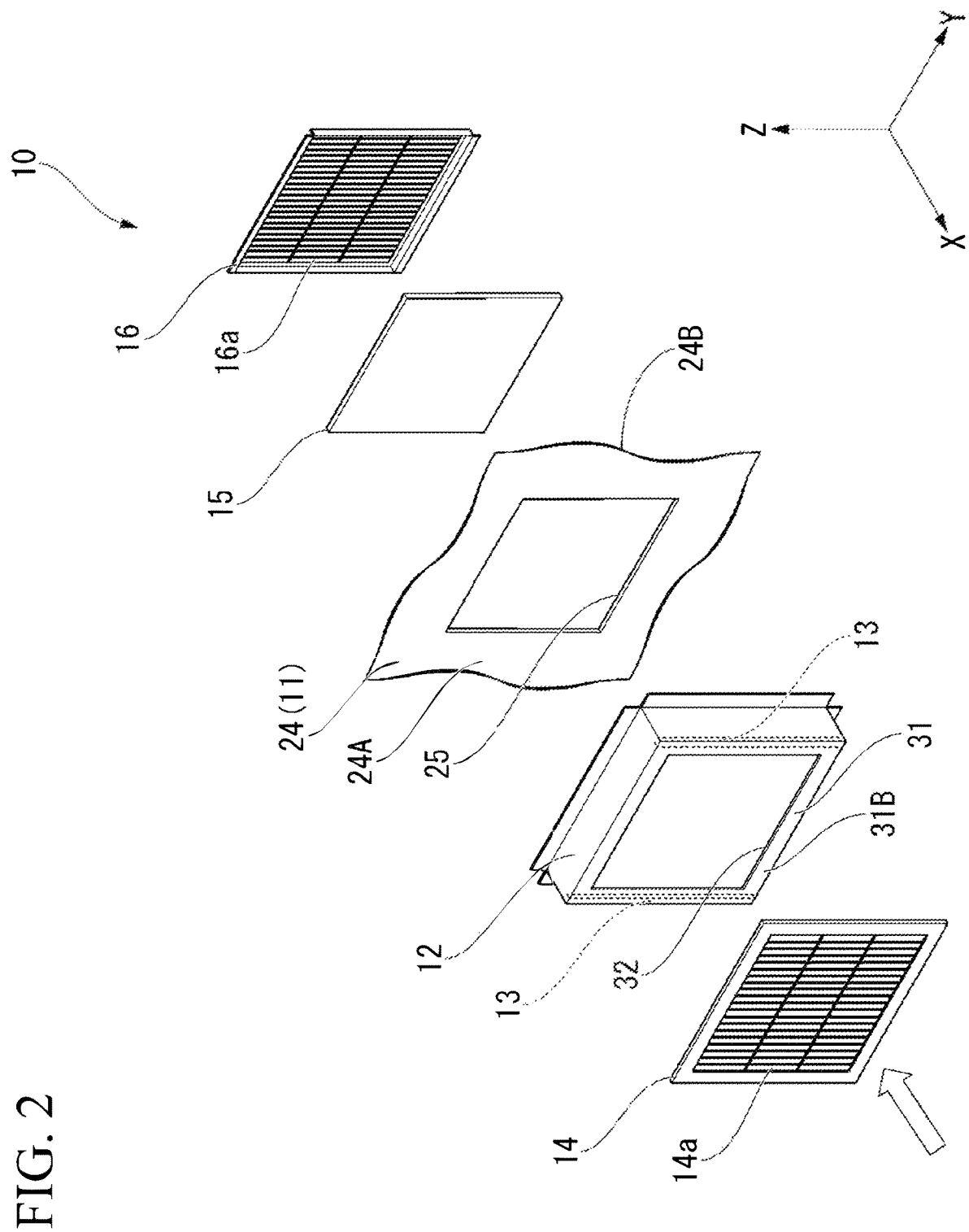
FIG. 2 is an exploded perspective view of the dust-proof structure of the embodiment.
Figure 3:
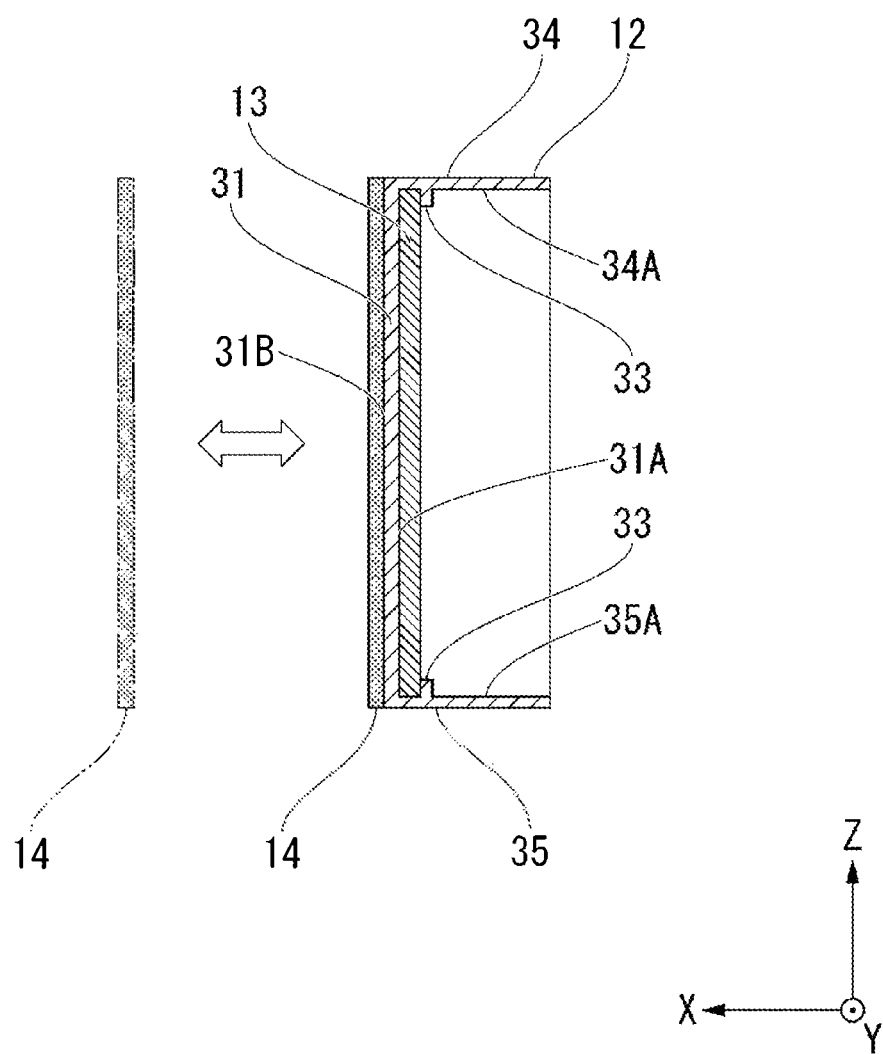
FIG. 3 is a cross-sectional view showing a front portion of the dust-proof structure of the embodiment broken in a cross-section parallel to an X-Z plane.

FIG. 1 is a perspective view of a dust-proof structure 10 of an embodiment. FIG. 2 is an exploded perspective view of the dust-proof structure 10 of the embodiment. FIG. 3 is a cross-sectional view showing a front portion of the dust-proof structure 10 of the embodiment broken in a cross-section parallel to an X-Z plane.

Hereinafter, each axis direction of the X-axis, the Y-axis, and the Z-axis orthogonal to one another in a three-dimensional space is a direction parallel to each axis of the device. For example, a forward-rearward direction of the dust-proof structure 10 is parallel to the X-axis direction. A positive direction in the X-axis direction is a direction toward a front portion from a rear portion of the dust-proof structure 10. A rightward-leftward direction of the dust-proof structure 10 is parallel to the Y-axis direction. A positive direction in the Y-axis direction is a direction toward a left side from a right side of the dust-proof structure 10. An upward-downward direction and a vertical direction of the dust-proof structure 10 are parallel to the Z-axis direction. A positive direction in the Z-axis direction is a direction toward an upper portion from a lower portion of the dust-proof structure 10.

As shown in FIG. 1, the dust-proof structure 10 of the embodiment is provided on a variety of boards 1 provided on an electrical facility or the like. The board 1 is, for example, a switchboard, a distribution board, a control board, and the like that constitute an electric power conversion apparatus, an electric power supply apparatus, a motor drive apparatus, and the like. The board 1 includes, for example, a variety of electric devices 2 such as a transformer, a switch, a circuit breaker, a measurement device, and a control device.

As shown in FIG. 1, FIG. 2, and FIG. 3, the dust-proof structure 10 includes a housing 11, a cover member 12, a plurality of permanent magnets 13, a magnetic material filter 14 (an example of a magnetic member and a first magnetic member in the claims), an air filter (an example of a filtration member in the claims) 15, and a magnetic material shield 16 (an example of a second magnetic member in the claims).

The housing 11 accommodates a variety of electric devices 2 in the inside of the housing 11. The housing 11 includes a fan 22 fixed to an upper portion 21. The fan 22 is arranged to close an exhaust port 23 that penetrates through the upper portion 21 of the housing 11. The exhaust port 23 is, for example, an opening having a rectangular shape.

An intake port 25 is formed on a front portion 24 of the housing 11. The intake port 25 is arranged, for example, so as to face the electric device 2 in the X-axis direction. The intake port 25 is, for example, an opening having a rectangular shape.

The fan 22 suctions air outside the housing 11 to the inside from the intake port 25 at the front portion 24 of the housing 11 and exhausts air inside the housing 11 to the outside from the exhaust port 23 at the upper portion 21 of the housing 11. The fan 22 cools the electric device 2 by the air that flows through the inside of the housing 11.

The outer shape of the cover member 12 is, for example, a rectangular box shape. The cover member 12 is formed, for example, of a non-magnetic material such as a synthetic resin that is not magnetized by a magnetic field.

The cover member 12 is fixed to a surface 24A of the front portion 24 of the housing 11. The cover member 12 covers the intake port 25 from the outside of the housing 11.

A ventilation port 32 is formed on a large part of a front portion 31 of the cover member 12. The ventilation port 32 faces, for example, the intake port 25 in the X-axis direction. The ventilation port 32 is, for example, an opening having a rectangular shape.

The cover member 12 includes a plurality of fixation members 33 that fix the plurality of permanent magnets 13 without causing the plurality of permanent magnets 13 to be in contact with the housing 11. The outer shape of each of the plurality of fixation members 33 is, for example, a protrusion having a rib shape.

The plurality of fixation members 33 are, for example, two pairs of fixation members 33. For example, each pair of the two pairs of fixation members 33 is spaced by a predetermined interval in the X-axis direction from either of both right and left ends (both ends in the Y-axis direction) on a rear surface 31A of the front portion 31 of the cover member 12. Each pair of the two pairs of fixation members 33 is two fixation members 33 that protrude inward in the Z-axis direction from each of rear surfaces 34A and 35A of an upper portion 34 and a lower portion 35 of the cover member 12.

The outer shape of each of the plurality of permanent magnets 13 is, for example, a rod shape having a quadrangular column shape. The plurality of permanent magnets 13 are, for example, a pair of permanent magnets 13. For example, the pair of permanent magnets 13 are fixed by the two pairs of fixation members 33 to both right and left ends (both ends in the Y-axis direction) on the rear surface 31A of the front portion 31 of the cover member 12. Each permanent magnet 13 is fixed by the pair of fixation members 33, for example, by a slide movement in the Y-axis direction, or the fixation of each permanent magnet 13 by the pair of fixation members 33 is released.

The pair of permanent magnets 13 magnetize a magnetic material filter 14 by a magnetic field. The pair of permanent magnets 13 fix the magnetic material filter 14 to the cover member 12 by a magnetic force.

The pair of permanent magnets 13 is easily removed from the cover member 12, for example, by releasing the fixation to the cover member 12 at the time of maintenance work or the like.

For example, even when conductive foreign material attached to the cover member is present due to the magnetic field of the pair of permanent magnets 13, the conductive foreign material is easily recovered by removing the pair of permanent magnets 13 from the cover member 12.

The outer shape of the magnetic material filter 14 is, for example, a rectangular grid or mesh shape in which a plurality of through-holes 14a are formed. The magnetic material filter 14 is, for example, formed of a ferromagnetic material such as iron.

The magnetic material filter 14 is fixed to a surface 31B of the front portion 31 of the cover member 12 by a magnetic force of the pair of permanent magnets 13. The magnetic material filter 14 covers the ventilation port 32 of the cover member 12. The fixation of the magnetic material filter 14 to the cover member 12 is released by an external force against the magnetic force of the pair of permanent magnets 13.

The magnetic material filter 14 is magnetized by a magnetic field of the pair of permanent magnets 13. The magnetic material filter 14 separates and collects foreign material such as conductive dust from the air that passes through the plurality of through-holes 14a toward the ventilation port 32 of the cover member 12 and the intake port 25 of the housing 11.

The magnetic material filter 14 is arranged outside the housing 11 and thereby prevents the conductive foreign material from entering the inside of the housing 11 from the intake port 25.

The magnetization of the magnetic material filter 14 by the pair of permanent magnets 13 is released, for example, by releasing the fixation to the cover member 12 at the time of maintenance work or the like. The conductive foreign material collected by the magnetized magnetic material filter 14 is easily separated from the magnetic material filter 14 of which the magnetization is released and is therefore easily recovered.

Since the magnetization of the magnetic material filter 14 is gradually released as the magnetic material filter 14 is separated from the pair of permanent magnets 13, the littering of the conductive foreign material collected by the magnetic material filter 14 into the air is prevented.

The outer shape of the air filter 15 is, for example, a rectangular mesh shape on which a plurality of through-holes are formed. The air filter 15 is, for example, formed of a non-magnetic material such as a synthetic resin that is not magnetized by a magnetic field.

The air filter 15 is, for example, fixed and sandwiched from both sides in the X-axis direction by the front portion 24 of the housing 11 and the magnetic material shield 16. The air filter 15 covers the intake port 25 from the inside of the housing 11.

The air filter 15 separates and collects foreign material from air that flows from the intake port 25 into the housing 11 and passes through the plurality of through-holes. The air filter 15 separates and collects foreign material that cannot be removed by the magnetic material filter 14 which is, for example, foreign material such as non-conductive dust from the air.

The outer shape of the magnetic material shield 16 is, for example, a rectangular grid or mesh shape in which a plurality of through-holes 16a are formed. The magnetic material shield 16 is, for example, formed of a ferromagnetic material such as iron.

The magnetic material shield 16 is fixed to a rear surface (inner surface) 24B of the front portion 24 of the housing 11. The magnetic material shield 16 is fixed to the housing 11, for example, by a fastener such as a screw. The magnetic material shield 16 covers the intake port 25 from the inside of the housing 11 together with the air filter 15.

The magnetic material shield 16 causes air that flows from the air filter 15 into the plurality of through-holes 16a to pass toward the inside of the housing 11. The magnetic material shield 16 blocks the magnetism between the electric device 2 inside the housing 11, and the magnetic material filter 14 and the pair of permanent magnets 13. The magnetic material shield 16 shields the electric device 2 inside the housing 11 from the magnetism of the magnetic material filter 14 and the pair of permanent magnets 13.

According to the embodiment described above, the dust-proof structure 10 includes the magnetic material filter 14 that covers the ventilation port 32 of the cover member 12 which is a flow path of the air that flows through the intake port 25 formed on the housing 11, and thereby, it is possible to prevent foreign material such as conductive dust from entering the inside of the housing 11.

The dust-proof structure 10 includes the pair of permanent magnets 13 that magnetize the magnetic material filter 14 and is fixed to the cover member 12 by a magnetic force, and thereby, it is possible to release the magnetization of the magnetic material filter 14 when the fixation of the magnetic material filter 14 is released. The conductive foreign material that is collected by the magnetized magnetic material filter 14 is easily separated from the magnetic material filter 14 of which the magnetization is released and is thereby easily recovered. The magnetization of the magnetic material filter 14 is gradually released as the magnetic material filter 14 is separated from the pair of permanent magnets 13, and thereby, the littering of the conductive foreign material collected by the magnetic material filter 14 into the air is prevented.

In the dust-proof structure 10, the cover member 12 includes two pairs of fixation members 33 that fix the pair of permanent magnets 13, and thereby, it is possible to easily remove the pair of permanent magnets 13 from the cover member 12. For example, even when conductive foreign material attached to the cover member is present due to the magnetic field of the pair of permanent magnets 13, the conductive foreign material is easily recovered by removing the pair of permanent magnets 13 from the cover member 12.

The dust-proof structure 10 includes the air filter 15 inside the housing 11 and can thereby separate and collect foreign material that cannot be removed by the magnetic material filter 14 which is, for example, foreign material such as non-conductive dust from air that flows into the inside of the housing 11 from the intake port 25.

The dust-proof structure 10 includes the magnetic material shield 16 inside the housing 11 and can thereby block the magnetism between the electric device 2 inside the housing 11, and the magnetic material filter 14 and the pair of permanent magnets 13. The magnetic material shield 16 can shield the electric device 2 inside the housing 11 from the magnetism of the magnetic material filter 14 and the pair of permanent magnets 13.

Hereinafter, a modification example is described.

The above embodiment is described using an example in which the magnetic material filter 14 covers the ventilation port 32 of the front portion 31 of the cover member 12; however, the embodiment is not limited thereto. The magnetic material filter 14 may cover a ventilation port formed at another portion other than the front portion 31 of the cover member 12.

Figure 4:
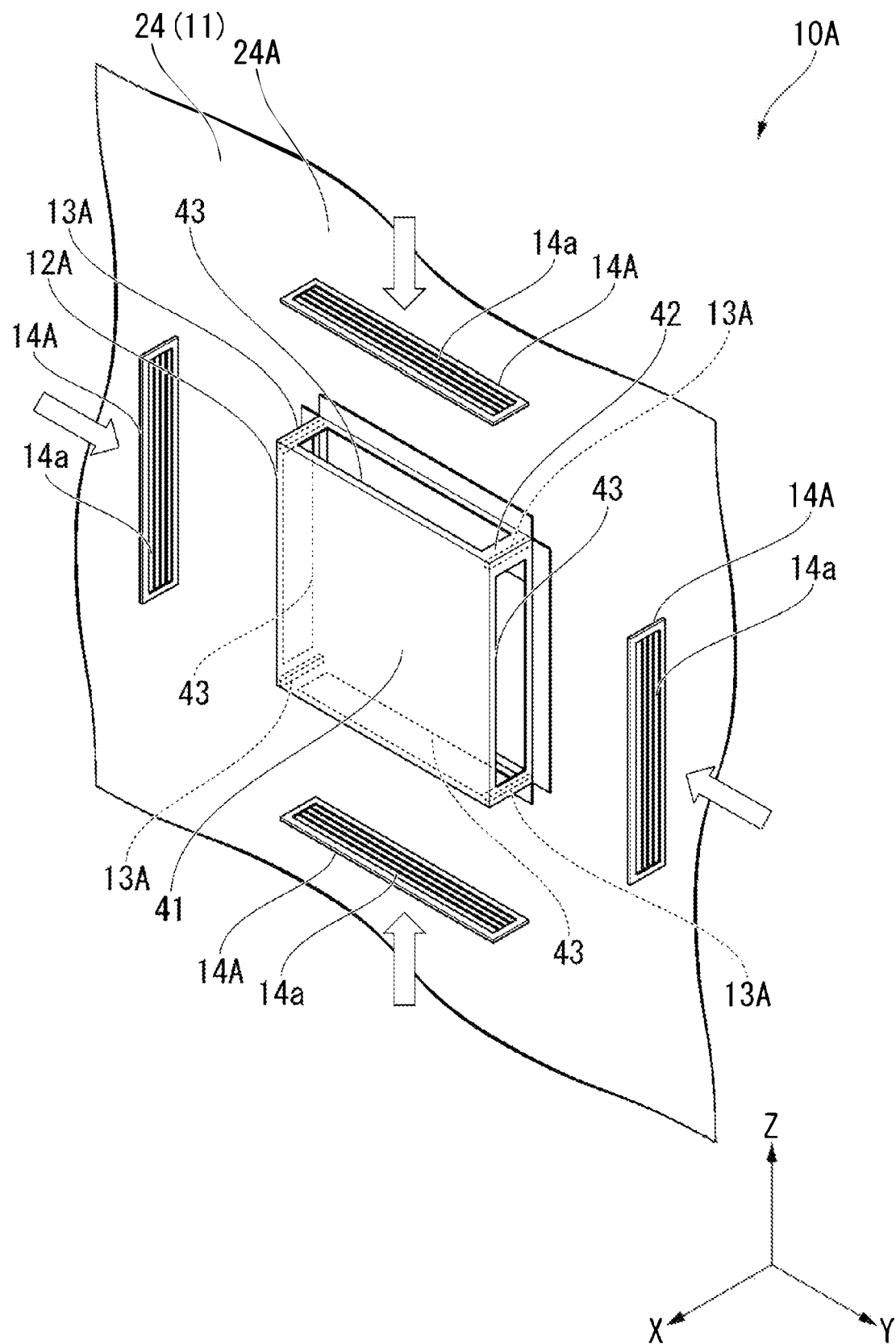
FIG. 4 is an exploded perspective view of a front portion of a dust-proof structure in a modification example of the embodiment.

FIG. 4 is an exploded perspective view of a front portion of a dust-proof structure 10A in a modification example of the embodiment.

As shown in FIG. 4, the dust-proof structure 10A of the modification example includes a cover member 12A, a plurality of permanent magnets 13A, and a plurality of magnetic material filters 14A of the modification example which are different from the cover member 12, the plurality of permanent magnets 13, and the magnetic material filter 14 of the embodiment described above.

The outer shape of the cover member 12A of the modification example is, for example, formed in a rectangular box shape. The cover member 12A of the modification example is formed, for example, of a non-magnetic material such as a synthetic resin that is not magnetized by a magnetic field. The cover member 12A includes, for example, a shield portion 41 and a support portion 42.

The outer shape of the shield portion 41 is, for example, a rectangular plate shape. The shield portion 41 covers the intake port 25 in the X-axis direction. The shield portion 41 is spaced by a predetermined interval in the X-axis direction from the surface 24A of the front portion 24 of the housing 11. At least part of the shield portion 41 overlaps the entire region of the intake port 25 when seen from the X-axis direction.

The outer shape of the support portion 42 is, for example, a rectangular cylindrical shape. The support portion 42 is integral with the shield portion 41. The support portion 42 is fixed to the surface 24A of the front portion 24 of the housing 11 at a circumferential edge portion of the intake port 25.

A plurality of ventilation ports 43 each penetrating in each of the Y-axis direction and the Z-axis direction are formed on the support portion 42. The plurality of ventilation ports 43 are, for example, a total of four ventilation ports 43, two of which are in each axis direction.

The outer shape of each of the plurality of permanent magnets 13A of the modification example is, for example, a rod shape having a quadrangular column shape. The plurality of permanent magnets 13 are, for example, four permanent magnets 13. For example, the four permanent magnets 13A are fixed by a plurality of fixation members to four corner portions on a rear surface of the support portion 42 of the cover member 12A. The four corner portions are right and left ends of an upper end and right and left ends of a lower end on the rear surface of the support portion 42. Each of the plurality of fixation members is, for example, a protrusion having a rib shape or the like that protrudes from the rear surface of the support portion 42.

The four permanent magnets 13A magnetize the four magnetic material filters 14A by a magnetic field. The four permanent magnets 13A fix the four magnetic material filters 14A to the support portion 42 of the cover member 12A by a magnetic force.

The outer shape of each of the plurality of magnetic material filters 14 of the modification example is, for example, a rectangular grid or mesh shape in which a plurality of through-holes 14a are formed. Each of the magnetic material filters 14 is, for example, formed of a ferromagnetic material such as iron.

The plurality of magnetic material filters 14A are, for example, four magnetic material filters 14A that cover four ventilation ports 43 of the support portion 42 of the cover member 12A. Each of the four magnetic material filters 14A is fixed to a surface of the support portion 42 of the cover member 12A by a magnetic force of the pair of permanent magnets 13A that are appropriately adjacent to each other among the four permanent magnets 13A. The fixation of each magnetic material filter 14A to the cover member 12A is released by an external force against the magnetic force of the appropriate pair of permanent magnets 13A.

Each of the four magnetic material filters 14 is magnetized by a magnetic field of the appropriate pair of permanent magnets 13A. Each of the magnetic material filters 14A separates and collects foreign material such as conductive dust from the air that passes through the plurality of through-holes 14a toward each ventilation port 43 of the support portion 42 of the cover member 12A and the intake port 25 of the housing 11.

The above embodiment is described using an example in which the magnetic material filter 14 is arranged outside the housing 11; however, the embodiment is not limited thereto. The magnetic material filter 14 may be arranged in a flow path of air that flows through the intake port 25 formed in the housing 11.

For example, the magnetic material filter 14 may be arranged inside the housing 11. For example, the cover member 12 to which the pair of permanent magnets 13 are fixed may be fixed to the rear surface 24B of the front portion 24 of the housing 11. The cover member 12 covers the intake port 25 from the inside of the housing 11. The magnetic material filter 14 is fixed to the cover member 12 by a magnetic force of the pair of permanent magnets 13 at the inside of the housing 11 and covers the ventilation port 32 of the cover member 12.

The above embodiment is described using an example in which the cover member 12 fixes the plurality of permanent magnets 13 by the plurality of fixation members 33 which are a protrusion having a rib shape; however, the embodiment is not limited thereto.

Each of the fixation members 33 may be, for example, a fastener such as a screw, an adhesive tape, or the like.

The above embodiment is described using an example in which the magnetic material filter 14 and each of the plurality of permanent magnets 13 are not in direct contact and are fixed to the cover member 12; however, the embodiment is not limited thereto.

For example, the magnetic material filter 14 and the plurality of permanent magnets 13 may be in direct contact and be fixed to the cover member 12 by a magnetic force.

For example, the fixation of at least one of the magnetic material filter 14 and the plurality of permanent magnets 13 to the cover member 12 may not be released.

For example, the cover member 12 may be omitted, and the magnetic material filter 14 and the plurality of permanent magnets 13 that are in direct contact by the magnetic force may be fixed to the housing 11.

The above embodiment is described using an example in which the air filter 15 is arranged between the front portion 24 of the housing 11 and the magnetic material shield 16; however, the embodiment is not limited thereto.

For example, the air filter 15 may be arranged outside the housing 11 or between the magnetic material shield 16 and the electric device 2.

For example, at least one of the air filter 15 and the magnetic material shield 16 may be omitted.

The above embodiment is described using an example in which only the magnetic material filter 14, 14A is magnetized; however, the embodiment is not limited thereto. The magnetic material shield 16 may be magnetized, and this magnetic material shield 16 may have a function as the magnetic material filter 14. In this case, the magnetic material filter 14 may not be provided.

According to at least one embodiment described above, the dust-proof structure 10 (or the dust-proof structure 10A) includes the magnetic material filter 14 (or the magnetic material filter 14A) which is magnetized and arranged in the flow path of the air that flows through the intake port 25 of the housing 11, and thereby, it is possible to prevent conductive foreign material from entering the inside of the housing 11.

Although some embodiments of the present invention have been described, these embodiments are presented as an example and do not limit the scope of the invention. These embodiments can be implemented in various other forms, and a variety of omissions, substitutions, and modifications can be made without departing from the scope of the invention. These embodiments and variations thereof are included in the scope and gist of the invention and are also included in the scope of the invention described in the appended claims and equivalence thereof.

DESCRIPTION OF THE REFERENCE SYMBOLS

1 Board
2 Electric device
10 Dust-proof structure
11 Housing
12 Cover member
13 Permanent magnet
14 Magnetic material filter (magnetic member, first magnetic member)
15 Air filter (filtration member)
16 Magnetic material shield (second magnetic member)
25 Intake port
32 Ventilation port
33 Fixation member

The invention claimed is:

1. A dust-proof structure comprising: a housing which accommodates an electric device and on which a first ventilation port is formed; a non-magnetic cover member that covers the first ventilation port and has a second ventilation port different from the first ventilation port; a first magnetic member that is attachably and detachably fixed to the cover member, is formed to cover the second ventilation port, has a hole through which a gas flowing through the first ventilation port passes, and is magnetized by being fixed to the cover member; and a permanent magnet that is fixed to the cover member not in contact with the housing, magnetizes the first magnetic member, and fixes the first magnetic member to the cover member by a magnetic force, wherein the first magnetic member that is magnetized by a magnetic field of the permanent magnet separates and collects a conductive foreign material from the gas that passes through the hole toward the second ventilation port of the cover member and the first ventilation port of the housing; and a filtration member that is arranged in a flow path of the gas and covers the first ventilation port from an inside of the housing; and a second magnetic member that is different from the first magnetic member and the permanent magnet and is arranged at the inside of the housing between the electric device and the first magnetic member; and the filtration member is fixed and sandwiched by the housing and the second magnetic member.

2. The dust-proof structure according to claim 1, comprising:
a fixation member that fixes the permanent magnet to the cover member.

3. The dust-proof structure according to claim 1, wherein the first magnetic member is formed of a ferromagnetic material.

* * * * *